(12) United States Patent
Wang et al.

(10) Patent No.: US 8,063,683 B2
(45) Date of Patent: Nov. 22, 2011

(54) LOW POWER CLOCK AND DATA RECOVERY PHASE INTERPOLATOR

(75) Inventors: Hui Wang, Arlington, TX (US); Lixin Jiang, Shanghai (CN); Yehui Sun, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 37 days.

(21) Appl. No.: 12/480,604

(22) Filed: Jun. 8, 2009

(65) Prior Publication Data
US 2010/0308880 A1 Dec. 9, 2010

(51) Int. Cl.
*H03L 7/00* (2006.01)
(52) U.S. Cl. .......................................... 327/163; 327/231
(58) Field of Classification Search .......................... None
See application file for complete search history.

(56) References Cited

U.S. PATENT DOCUMENTS

| | | | |
|---|---|---|---|
| 6,122,336 A | 9/2000 | Anderson | |
| 6,466,098 B2 * | 10/2002 | Pickering | 331/25 |
| 7,173,466 B2 * | 2/2007 | Chiba et al. | 327/231 |
| 7,180,352 B2 * | 2/2007 | Mooney et al. | 327/237 |
| 7,196,564 B2 * | 3/2007 | Rajagopal et al. | 327/246 |
| 7,206,370 B2 * | 4/2007 | Nakao | 375/376 |
| 7,271,969 B2 * | 9/2007 | Carpenter et al. | 360/51 |
| 7,496,781 B2 * | 2/2009 | Tamura et al. | 713/600 |
| 2004/0088594 A1 * | 5/2004 | Canagasaby et al. | 713/400 |
| 2006/0227917 A1 * | 10/2006 | Buchwald et al. | 375/355 |

FOREIGN PATENT DOCUMENTS
WO      WO 01/84702      11/2001

OTHER PUBLICATIONS

Yehui et al., "Analysis and Design of a Phase Interpolator for Clock and Data Recovery", *Journal of Semiconductors*, vol. 29, No. 5, May 2008, pp. 930-935.

* cited by examiner

*Primary Examiner* — Cassandra Cox
(74) *Attorney, Agent, or Firm* — Finnegan, et al.

(57) ABSTRACT

A phase interpolator is provided. The phase interpolator comprises a plurality of reference stages, the reference stages receiving a reference signal having a predetermined phase and outputting a component signal, wherein the reference stages comprise a plurality of current source circuits, and the current source circuits comprise a plurality of transistors, and the transistors of the current source circuits are coupled to one another by the drains of the transistors.

16 Claims, 4 Drawing Sheets

US 8,063,683 B2

LOW POWER CLOCK AND DATA RECOVERY PHASE INTERPOLATOR

TECHNICAL FIELD

Embodiments disclosed herein are related to a phase interpolator which may be used in a clock and data recovery system.

DISCUSSION OF RELATED ART

Modern high-speed serial transceivers have received wide application in cross-chip and serial data communication networks. In contrast to their parallel counterparts, high-speed serial transceivers have the capability of extracting a clock signal encoded within a received data stream, allowing for network synchronization over a single data channel. This capability has subsequently eliminated the requirement of sending data and synchronization clock signals over multiple channels. In addition, several parallel data channels may be multiplexed and transmitted through a single serial data channel, increasing data transmission rates. These methods eliminate the stringent requirements on skew control between clock and data signals present in parallel data communication networks, and greatly simplify overall system design.

Designing reliable clock and data recovery ("CDR") methods and systems, having the capability of extracting clock and data information contained within a transmitted serial data stream, proves crucial in the implementation of high-speed serial transceiver systems. A CDR system implemented in a high-speed serial transceiver may have multiple operating modes that depend on the state of an incoming input data stream. For example, during serial data link initialization before payload data is transmitted, data received by the serial transceiver may contain a CDR training data stream pattern. The training data stream may contain a synchronization clock signal embedded within rich data transitions in the data stream. By aligning an internal sampling clock to the embedded clock signal, the internal clock of the serial transceiver can be synchronized with the embedded clock signal. This process is called bit lock acquisition. Once bit lock is achieved, the serial transceiver may begin payload data transmission. Accordingly, due to inherent data transfer latencies during bit lock acquisition, reducing the time needed to achieve bit lock is a primary consideration in CDR system design.

During the transmission of payload data, the serial receiver must track minor phase changes in the incoming data. These minor phase changes are caused by a number of factors including system clock jitter and lane-to-lane interference. When left untracked by the CDR system, input data jitter can result in the overall degradation of system performance due to an increased bit error rate ("BER"). In order to reduce the BER, the CDR system needs to extract a clock signal from the received data and adjust the phase of the extracted clock signal to produce a recovered clock signal.

Several methods have been used to adjust the phase of the recovery clock signal. For example, phase lock loop (PLL) circuits change the phase of the recovery clock signal by changing a clock frequency using a voltage controlled oscillator (VCO). Delay lock loop (DLL) circuits change a frequency of the recovery clock signal by implementing a predetermined delay into the recovery clock signal using delay cells. Although PLL and DLL circuits are relatively easy to implement, they suffer from high power consumption, and require an analog implementation.

Consequently, phase interpolator circuits have been used in CDR, particularly in serial communications. A conventional phase interpolator circuit 100 is illustrated in FIG. 1. As shown in FIG. 1, conventional phase interpolator circuit 100 includes four reference stages 102, 104, 106, and 108, which are coupled together and to a power supply voltage $V_{DD}$ via resistors 110 and 112. Each reference stage 102, 104, 106, and 108 receives a reference signal, which corresponds to a clock signal having its phase offset by multiples of 90°, such that reference stage 102 receives the clock signal having no phase offset, reference stage 104 receives the clock signal having its phase offset by 90°, reference stage 106 receives the clock signal having its phase offset by 180°, and reference stage 108 receives the clock signal having its phase offset by 270°. Reference stages 102, 104, 106, and 108 then output a scaled clock signal, which when combined, provides a recovery clock signal which can have any desired phase. The scaled clock signal output from reference stage 102 is A sin ωt, the scaled clock signal output from reference stage 104 is B cos ωt, the scaled clock signal output from reference stage 106 is −C sin ωt, and the scaled clock signal output from reference stage 108 is −D cos ωt, wherein A, B, C, and D are the scaling coefficients respectively generated by reference stage 102, reference stage 104, reference stage 106, and reference stage 108.

Although only specifically illustrated and labeled in reference stage 108, each reference stage 102, 104, 106, and 108 includes N number of current source circuits 114. Each current source circuit 114 includes a differential pair of transistors 116 and 118 coupled to a current source 120. In operation, current sources 120 may be turned on by a control signal such that scaling coefficients A, B, C, and D are determined by the number of current sources 120 turned on divided by 1/N, each turned on current source 120 providing a phase step. Depending on how many current sources 120 are turned on, the recovered clock signal is interpolated by the scaled clock signals output from reference stages 102, 104, 106, and 108.

Conventional phase interpolators, such as shown in FIG. 1, offer a lower-powered alternative in CDR to PLL and DLL implementations. However, each phase step of the interpolator must be monotonic with the input clock coefficients. Mismatches between first and second transistors 116 and 118 throughout the plurality of source current circuits 114 will cause the phase step to not be monotonic with the input clock coefficients. In addition, current sources 120 include transistors with transistor length typically chosen to be large in order to minimize the effects of transistor mismatches. However, the large current source transistors create problems when trying to integrate phase interpolator circuits into devices made using sub-micron processes. Moreover, the transistor length of transistors 116 and 118 is designed to be small in order to meet clock signal bandwidth requirements. Mismatch of transistor threshold of the differential pair can cause mismatch of the drain-source voltage $V_{ds}$ across transistors of current source 120. These mismatches may then cause the phase step to be non-monotonic and cause excessive jitter in the recovered clock signal. Furthermore, in order to overcome the excessive jitter and eliminate the mismatches, conventional phase interpolators often use larger transistors. However, the use of larger transistors may be problematic as they are not able to be used in circuits which require a high-speed clock bandwidth, or in smaller circuits.

There is therefore a need for a phase adjustment circuit for use in clock data recovery which has a low power requirement and eliminates excessive jitter in a recovered clock signal.

SUMMARY

Consistent with the disclosed embodiments a phase interpolator is provided. The phase interpolator includes a plurality of reference stages, the reference stages receiving a reference signal having a predetermined phase and outputting a scaled clock signal, wherein the reference stages comprise a plurality of current source circuits, and the current source circuits comprise a plurality of differential pairs of transistors which generate a differential component signal, and the differential pairs of transistors of the current source circuits are coupled to one another by the drains of the differential pairs of transistors.

Consistent with the disclosed embodiments, there is also provided a method for adjusting a phase of a clock recovery signal, including providing a phase interpolator having a plurality of reference stage circuits each having a plurality of current source circuits coupled via drains of transistors in the current source circuits; receiving a clock signal generating a phase adjustment signal corresponding to the received clock signal receiving, at the phase interpolator, the phase adjustment signal generating, at the phase interpolator, at least one reference signal corresponding to the phase adjustment signal, scaling the at least one reference signal which has a predetermined phase offset, and outputting a clock recovery signal having the predetermined phase offset.

Further consistent with the disclosed embodiments, there is provided a phase interpolator for receiving an input clock signal and outputting a clock recovery signal having a predetermined phase. The phase interpolator includes a plurality of reference stages, the reference stages receiving a reference signal having a predetermined phase and outputting a scaled clock signal. The reference stages include a plurality of current source circuits, the current source circuits receiving the reference signal and outputting a differential component signal. The current source circuits include a first transistor having a drain, a source, and a gate, the first transistor receiving the reference signal, a second transistor having a drain, a source, and a gate, the drain of the second transistor coupled to the drain of the first transistor and receiving an inverse of the reference signal, and a current source coupled to the drain of the first transistor and the drain of the second transistor, the current source receiving a control signal, and outputting an output current to the first and second transistor in response to the control signal, wherein the differential component signal is the reference signal modified proportional to the output current, the scaled clock signal is the sum of the differential component signals generated by the current source circuits in a reference stage, and the drains of the first and second transistor are coupled to the drains of first and second transistors in each of the current source circuits in a reference stage.

These and other embodiments will be described in further detail below with respect to the following figures.

Figure 1:
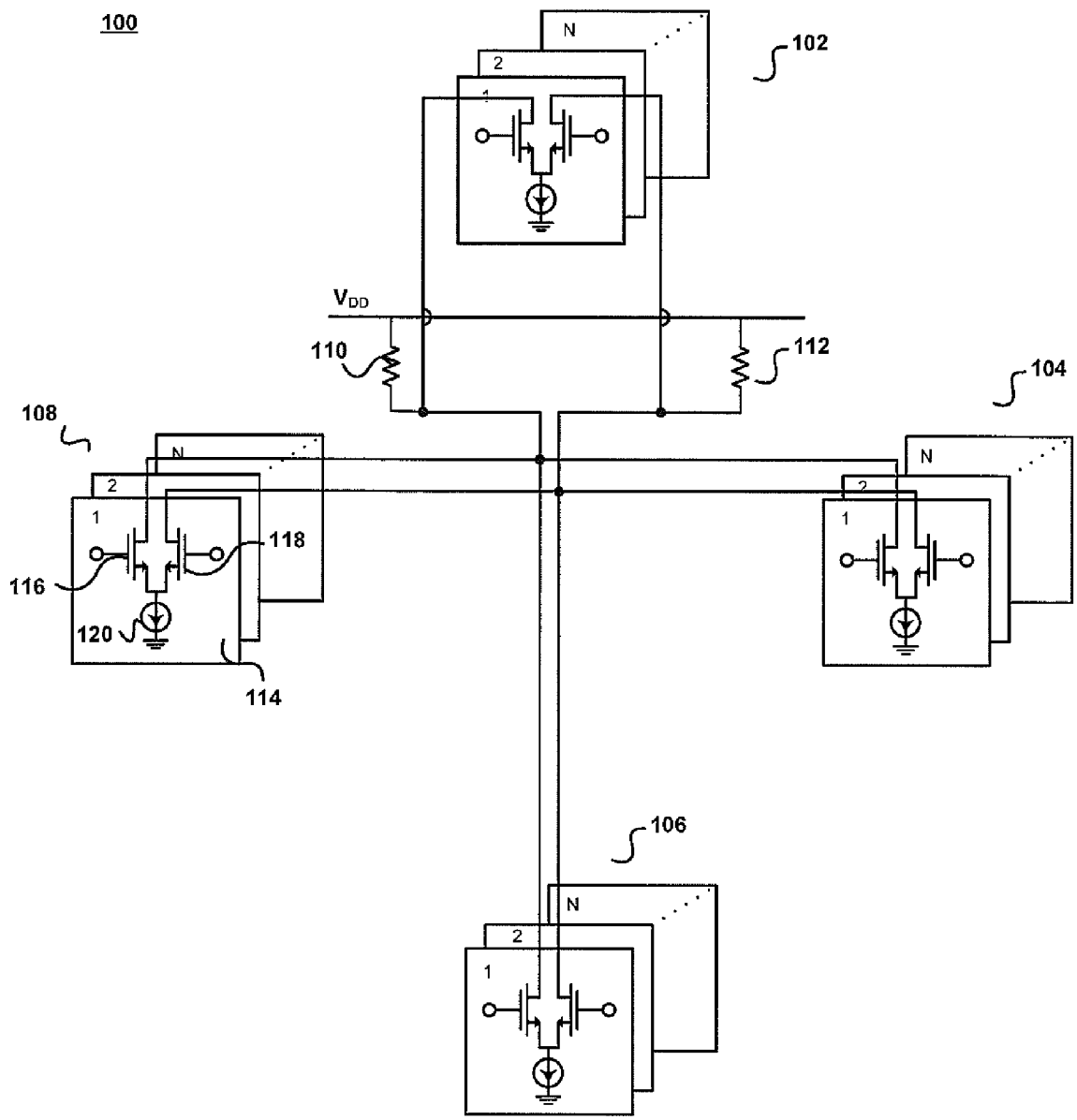
FIG. 1 is a diagram illustrating a conventional phase interpolator.

In the drawings, elements having the same designation have the same or similar functions.

DETAILED DESCRIPTION OF THE DISCLOSED EMBODIMENTS

In the following description specific details are set forth describing the embodiments disclosed herein. It will be apparent, however, to one skilled in the art that some embodiments may be practiced without some or all of these specific details. The specific embodiments disclosed herein are meant to be illustrative but not limiting. One skilled in the art may realize other material that, although not specifically described herein, is within the scope and spirit of this disclosure.

Figure 2:
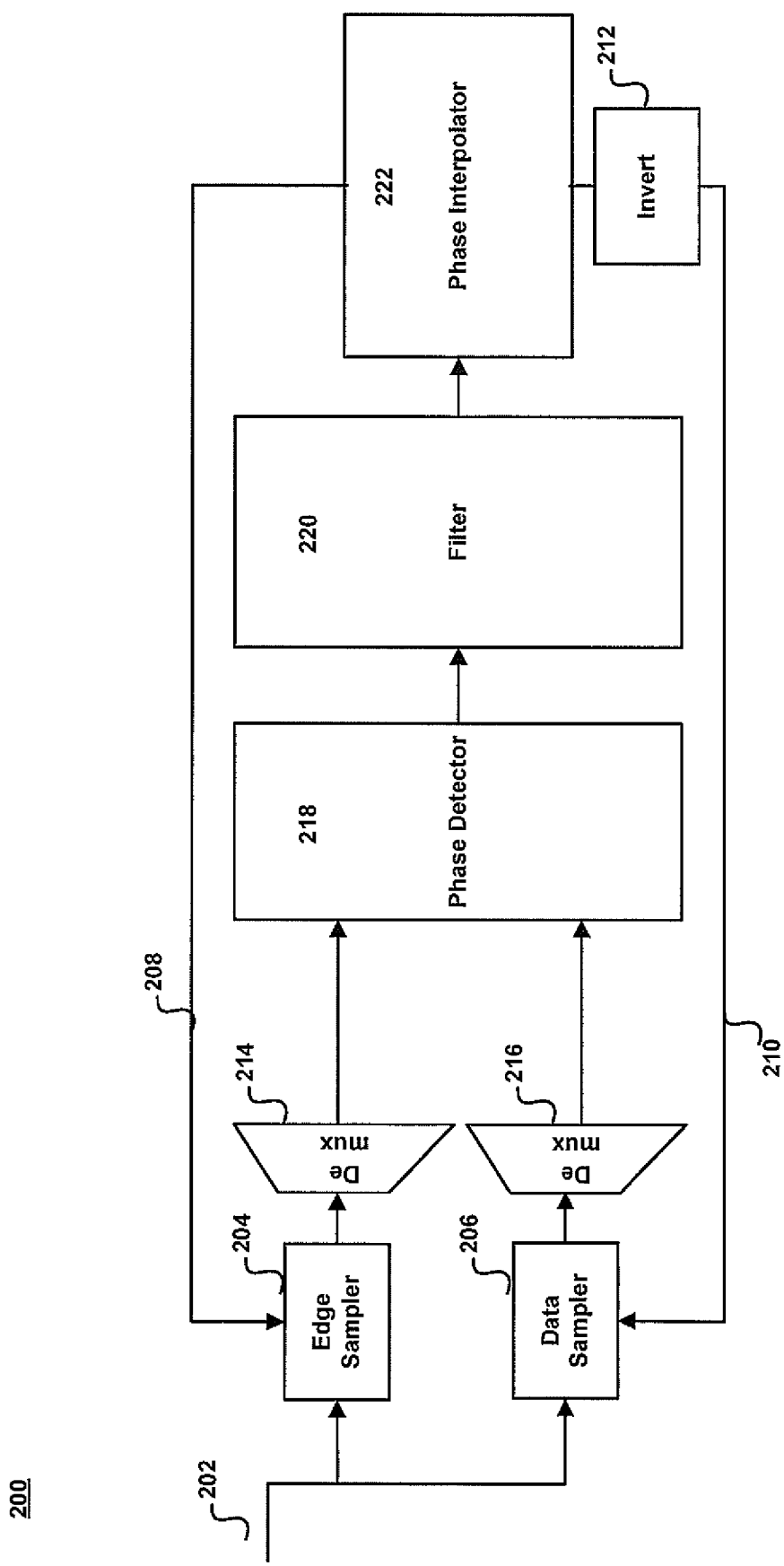
FIG. 2 illustrates a schematic block diagram of a clock and data recovery system using a phase interpolator, consistent with the disclosed embodiments.

FIG. 2 illustrates a schematic block diagram of a CDR system 200 using a phase interpolator, consistent with some embodiments. As shown in FIG. 2, a digital data stream 202 is coupled into an edge transition sampler 204 and a data sampler 206. Edge transition sampler 204 is driven by a clock signal 208 that is edge aligned with data edge transitions of digital data stream 202. Data sampler 206 is driven by a clock signal 210 corresponding to the edge aligned clock signal 208 inverted in inverter 212.

After sampling digital data stream 202, the sampled data signal and data edge clock signal is coupled into demultiplexers 214, 216 to separate any multiplexed data channels contained in input data stream 202. The demultiplexed signal is then transmitted into phase detector 218, which detects whether the data edge clock signal leads or lags the sampled data signal and generates a phase difference signal corresponding to the detected phase difference between the data edge clock signal and sampled data signal. In some embodiments, phase detector 218 may compare sampled data edge clock signal values with received and previously received sampled data signal values to determine a lead/lag phase relationship between the data edge clock signal and the sampled data signal. A phase difference signal may be generated based on the determined lead/lag phase relationship. For example, if the data edge clock signal leads the sampled data signal, a phase difference signal may be generated that indicates the data edge clock signal leads the sampled data signal. Similarly, if the data edge clock signal lags the sampled data signal, a phase difference signal may be generated that indicates the data edge clock signal lags the sampled data signal. If there is no detected lead/lag relationship, a signal indicating that the data edge clock signal and the sampled data signal are phase aligned may be generated. The phase difference signal generated by phase detector 218 is subsequently passed to a filter 220. In accordance with some embodiments, filter 220 may be a low-pass filter or a variable bandwidth filter. Filter 220 generates a phase adjustment signal for use by a phase interpolator 222.

Based on the phase adjustment signal generated by filter 220, phase interpolator 222 generates a clock signal 208 at a frequency and phase which is near the same frequency and phase of data stream 202. In some embodiments, the output signal 208 of the phase interpolator 222 may be given by:

$$Pi(n)=Pi(n-1)+lf(n)$$

wherein Pi is the previous output clock signal phase 210 of the phase interpolator, lf is the output of filter 220, and n is an incrementing counter value.

Figure 3:
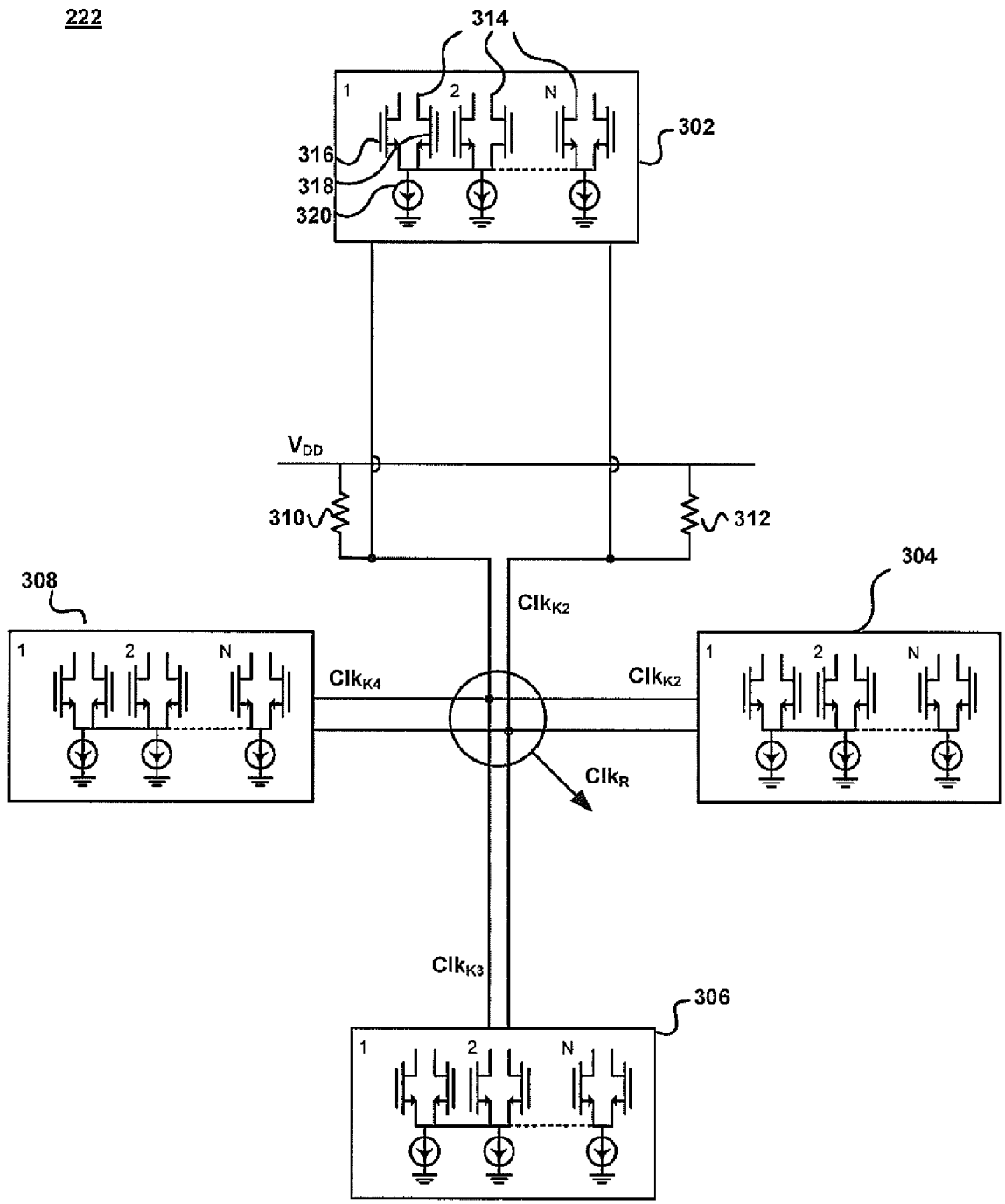
FIG. 3 is a diagram showing a phase interpolator consistent with the disclosed embodiments.

FIG. 3 is a diagram showing phase interpolator 222, consistent with some embodiments. As shown in FIG. 3, phase interpolator 222 includes four reference stages 302, 304, 306, and 308, which are coupled together and to a power supply voltage $V_{DD}$ via resistors 310 and 312. Each reference stage 302, 304, 306, and 308, receives a reference signal, which corresponds to a clock signal that is offset by 90°, and outputs a scaled clock signal $Clk_K$, each of which has a predetermined swing step, and when combined with the scaled clock signals output from the other reference stages, provides a recovery clock signal $Clk_R$ that can having a predetermined phase step. The scaled clock signal $Clk_{K1}$ output from reference stage 302 is $K_1 \sin \omega t$, the scaled clock signal output $Clk_{K2}$ from reference stage 304 is $K_1 \sin \omega t$, the scaled clock signal $Clk_{K3}$ output from reference stage 306 is $-K_3 \sin \omega t$, and the scaled clock signal $Clk_{K4}$ output from reference stage 308 is $-K_4 \cos \omega t$, wherein $K_1$, $K_2$, $K_3$, and $K_4$ are the scaling coefficients respectively generated by reference stage 302, reference stage 304, reference stage 306, and reference stage 308. The recovery clock signal $Clk_R$ is determined by the sum of the scaled clock output signals from all of the reference stages, and is thus determined by $Clk_R = K_1 \sin \omega t + K_2 \cos \omega t - K_3 \sin \omega t - K_4 \cos \omega t = K \sin(\omega t + \phi)$, where $\phi$ is the phase offset of recovery clock signal $Clk_R$.

Each reference stage 302, 304, 306, and 308 includes N number of current source circuits 314. Each current source circuit 314 includes a differential pair of transistors 316 and 318 coupled to a current source 320. Consistent with the disclosed embodiments, the differential pairs of transistors 316 and 318 of each of the 1 to N current source circuits 314 are coupled together via the drains of the differential pairs of transistors 316 and 318. By coupling the drains of the differential pairs of transistors 316 and 318 of all current source circuits 314 in a reference stage, drain-source voltage ($V_{ds}$) mismatches amongst transistors of current source 320 no longer affect the monotonicity of differential component signals output from each of the current source circuits 314, and thus do not affect the monotonicity of the phase step of scaled clock signal $Clk_K$ output from each of the reference stages 302, 304, 306, and 308.

Figure 4:
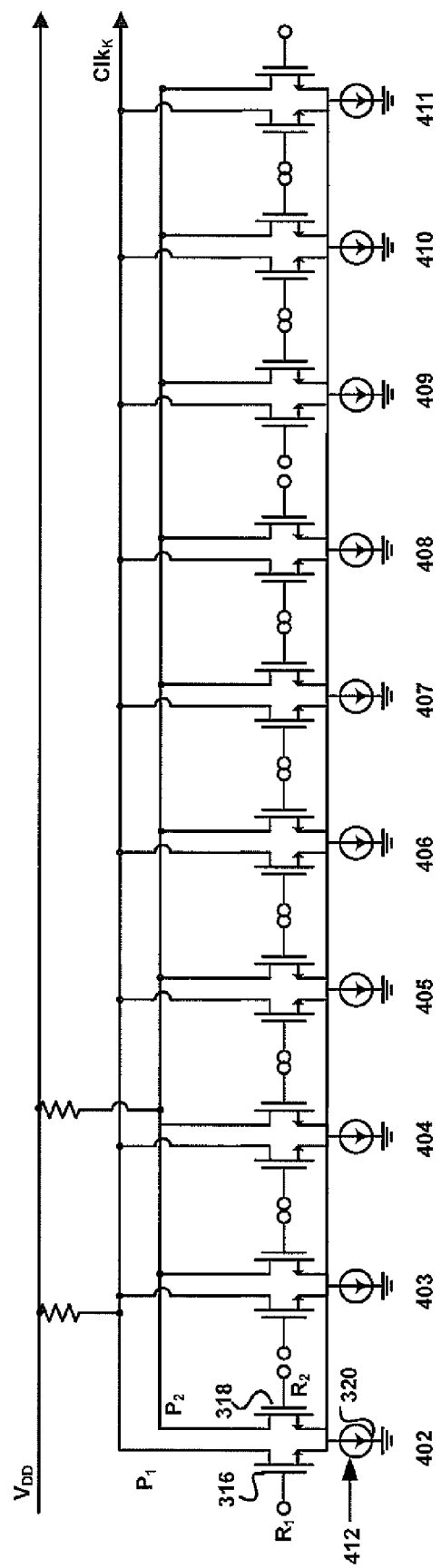
FIG. 4 shows a diagram illustrating a reference stage consistent with the disclosed embodiments.

FIG. 4 shows a diagram illustrating a particular example of reference stage 400, which may correspond to any of reference stage 302, 304, 306, or 308 shown in FIG. 3, consistent with some embodiments. As shown in FIG. 4, reference stage 302 includes ten (10) current source circuits 402-411, each of which are coupled together via drains of the differential pairs of transistors 316 and 318.

Each of the current source circuits receives a first reference signal $R_1$ at a gate of the first transistor 316, and a second reference signal $R_2$ at a gate of the second transistor 318. The second reference signal $R_2$ may be the inversion of first reference signal $R_1$. First and second reference signals $R_1$ and $R_2$ are modified by a current generated by current source 320 in response to a control signal 412 received by current source 320. Consistent with some embodiments, control signal 412 is generated in response to a phase code determined by filter 220 shown in FIG. 2. The modified signals $P_1$ and $P_2$ output from transistors 316 and 318 are differential component signals which may determine a swing step of the scaled clock signal $Clk_K$ output by reference stage 400, such that the scaling coefficient K of reference stage 400 is determined by the swing steps determined by all of the current source circuits 314 in reference stage 400.

Consistent with some embodiments, current source 320 of current source circuits 402-411 include a plurality of unit current sources, each of which are capable of generating a unit current I, wherein each unit current I may correspond to a swing step of a scaled clock signal $Clk_K$. Consistent with the disclosed embodiments, unit current sources of current source 320 may be a plurality of transistors. In some embodiments, current source 320 of each of current source circuits 402-408 includes eight (8) unit current sources, such that current source 320 of current source circuits 402-408 are each capable of generating a total current of up to 8I. Consistent with some embodiments, current source 320 of current source circuit 409 includes four (4) unit current sources such that current source 320 of current source circuit 409 is capable of generating a total current of up to 4I. Consistent with some embodiments, current source 320 of current source circuit 410 includes two (2) unit current sources such that current source 320 of current source circuit 410 is capable of generating a total current of up to 2I. Consistent with some embodiments, current source 320 of current source circuit 411 includes one (1) unit current source such that current source 320 of current source circuit 411 is capable of generating a current of I. Accordingly, consistent with some embodiments, reference stage 400 is capable of generating a total of 63 unit currents I, corresponding to a total of 63 swing steps.

As shown in FIG. 4, each current source 320 receives a control signal 412. In response to control signal 412, current source 320 generates a current which is a predetermined multiple of unit current I. As discussed above, current source 320 of current source circuits 402-408 may generate a current of up to 8I, current source 320 of current source circuit 409 may generate a current of up to 4I current source 320 of current source circuit 410 may generate a current of up to 2I, and current source 320 of current source circuit 411 may generate a current of up to I.

Consistent with some embodiments, control signal 412 received by transistors 402-408 may be a thermometer-coded control signal, enabling current source 320 of current source circuits 402-408 to generate a current having a value of 0 or 8I. Because differential component signals output by current source circuits 402-408 generate a current of 0 or 8I, these signals provide coarse phase adjustment, and correspond to the most significant bits (MSB's) of scaled clock signal $Clk_K$ output from reference stage 400.

Consistent with some embodiments, control signal 412 received by transistors 409-411 may be a binary-coded control signal, signaling current source 320 of current source circuits 409-411 to generate a current. Differential component signals output by current source circuits 409-411 provide values of 4I, 2I, and I, respectively, and therefore provide fine phase adjustment, and thus may correspond to the least significant bits (LSB's) of scaled clock signal $Clk_K$ output from reference stage 400.

Consistent with some embodiments, the scaling coefficients $K_1$, $K_2$, $K_3$, and $K_4$ are the scaling coefficients respectively generated by reference stage 302, 304, 306, and 308, shown in FIG. 3, is determined by the number of unit currents I generated by each reference stage, such that $$K_m = \sum_1^i I_i,$$

wherein i is the total number of unit currents being generated by each reference stage. Each individual unit current $I_i$ may be determined by the following:

$$I_i = \mu_n C_{ox} \left(\frac{W}{L}\right)_i (V_{gs} - V_{th_i})^2 (1 + \lambda V_{ds}),$$

where $\mu_n$ is a mobility of a unit current source transistor, $C_{ox}$ is a unit capacitance of a gate of the unit current source transistor, $$\left(\frac{W}{L}\right)_i$$

is a size of the unit current source transistor, $V_{gs}$ is a gate-source voltage of the transistor of current source 320, $V_{th_i}$ is a threshold voltage for the $i^{th}$ current unit, $\lambda$ is a channel length modulation coefficient, and $V_{ds}$ is a drain-source voltage of the transistor of current source 320.

As can be seen from the above equation, mismatches between drain-source voltages $V_{ds}$ of the transistor of current source 320 will cause the calculated value of the unit current $I_i$ to vary between current source circuits 314. The variation of the value of the unit current $I_i$ causes unequal differential component signals output by current source circuits 314, which affects the monotonicity of the swing steps, and which ultimately affects the monotonicity of the phase step of clock recovery output signal $Clk_R$. Because all of the differential pairs of transistors 316 and 318 in each current source circuit 314 of the reference stages are coupled via their drains, $V_{ds}$ for all of the transistors of current sources 320 are the same, which eliminates any effect on the monotonicity of the differential component signal which could otherwise be caused by mismatches between transistors 316 and 318. Accordingly, transistors 316 and 318 may be chosen to be a smaller size than in conventional phase interpolators, allowing for easier integration into smaller packages, and used in solutions which require a high-speed clock bandwidth.

The monotonicity of the phase step may still be affected by mismatches in the transistors of current sources 320. That is, values such as $$\left(\frac{W}{L}\right)_i$$

and $V_{th_i}$ may still affect the monotonicity of the phase step. However, because the transistors of current source 320 are not in the signal path of the reference signal or the differential component outputs, the size of these transistors are not as important. Therefore, larger transistors which can be more easily matched can be used as the current source 320 transistors to eliminate any transistor mismatches which may affect the monotonicity of the phase step.

In accordance with aspects of the disclosed embodiments, a phase interpolator as described herein, may eliminate the non-monotonicity of phase steps produced by mismatches in the differential transistor pair, which allows for improved jitter elimination, and allows for meeting a high-speed clock bandwidth requirement. Accordingly, embodiments disclosed herein may provide a clock recovery circuit, that may be used in a high-speed device, such as a high-speed serial transceiver, which is efficient and consumes little power.

For illustrative purposes, the disclosed embodiments have been specifically described above. This disclosure is not intended to be limiting. Therefore, embodiments disclosed herein are limited only by the following claims.

What is claimed is:

1. A phase interpolator, comprising:
  a plurality of reference stages, the reference stages receiving a reference signal having a predetermined phase and outputting a scaled clock signal, wherein
  the reference stages comprise a plurality of current source circuits,
  the current source circuits comprising a plurality of differential pairs of transistors that generate a differential component signal, the differential pairs of transistors of the current source circuits being coupled to one another by drains of the differential pairs of transistors.

2. The phase interpolator of claim 1, wherein the current source circuits comprise:
  a first transistor having a drain, a source, and a gate, the first transistor receiving the reference signal;
  a second transistor having a drain, a source, and a gate, the drain of the second transistor coupled to the drain of the first transistor and receiving an inverse of the reference signal; and
  a current source coupled to the drain of the first transistor and the drain of the second transistor, the current source receiving a control signal, and outputting an output current to the first and second transistor in response to the control signal, wherein
    the differential component signal is the reference signal modified proportional to the output current.

3. The phase interpolator of claim 2, wherein the scaled clock signal comprises the reference signal offset by a phase shift.

4. The phase interpolator of claim 2, wherein the scaled clock signal comprises a sum of the differential component signals.

5. The phase interpolator of claim 2, wherein the plurality of reference stages comprises four reference stages, and a clock recovery signal is determined by the equation $Clk_R = K_1 \sin \omega t + K_2 \cos \omega t - K_3 \sin \omega t - K_4 \cos \omega t$, wherein $K_1 \sin \omega t$, $K_2 \cos \omega t$, $-K_3 \sin \omega t$, and $-K_4 \cos \omega t$ are the scaled clock signals respectively output by the four reference stages, and $K_1$, $K_2$, $K_3$, and $K_4$ are weighting coefficients representing a phase shift.

6. The phase interpolator of claim 3, wherein the phase shift is proportional to the output current.

7. The phase interpolator of claim 6, wherein the current source comprises a plurality, i, of unit current sources, the unit current sources each generating a unit current $I_i$.

8. The phase interpolator of claim 7, wherein the number of unit current sources generating a unit current $I_i$ is determined by the control signal.

9. The phase interpolator of claim 8, wherein the control signal is a thermometer coded control signal or a binary coded control signal.

10. The phase interpolator of claim 9, wherein the thermometer coded control signal is provided to current source circuits which generate most significant bits of the scaled clock signal, and the binary coded control signal is provided to current source circuits which generate least significant bits of the scaled clock signal.

11. The phase interpolator of claim 7, wherein the weighting coefficients are equal to a sum of the unit currents output by the unit current sources in a reference stage, wherein $$I_i = \mu_n C_{ox} \left(\frac{W}{L}\right)_i (V_{gs} - V_{th_i})^2 (1 + \lambda V_{ds}),$$

where $\mu_n$ is a mobility of a unit current source transistor, $C_{ox}$ is a unit capacitance of a gate of the unit current source transistor, $$\left(\frac{W}{L}\right)_i$$

is a size of the unit current source transistor, $V_{gs}$ is a gate-source voltage of a transistor of the unit current source transistor, $V_{th_i}$ is a threshold voltage for the $i^{th}$ current unit, $\lambda$ is a channel length modulation coefficient and $V_{ds}$ is a drain-source voltage of the unit current source transistor.

12. A method for adjusting a phase of a clock recovery signal, comprising:
    providing a phase interpolator having a plurality of reference stage circuits each having a plurality of current source circuits, each of the plurality of current source circuits including a differential pair of transistors coupled via drains of the differential pair of transistors and a current source coupled to the drains of the differential pair of transistors;
    receiving a clock signal;
    generating a phase adjustment signal corresponding to the received clock signal;
    receiving, at the phase interpolator, the phase adjustment signal;
        generating, at the phase interpolator, at least one reference signal corresponding to the phase adjustment signal;
        scaling the at least one reference signal to have a predetermined phase offset; and
        outputting a clock recovery signal having the predetermined phase offset.

13. The method of claim 12, wherein generating the at least one reference signal comprises generating four reference signals, each of the four reference signals having a different phase, the four reference signals each being offset by ninety degrees.

14. The method of claim 12, wherein scaling the at least one reference signal comprises generating currents in some of the plurality of current source circuits, the generated currents determining a scaling factor for scaling the reference signal.

15. The method of claim 12, wherein outputting the clock recovery signal comprises combining signals generated by the plurality of reference stage circuits, each of the reference stage circuits scaling the reference signal by an amount determined by the generation of the current source circuits coupled via drains of transistors in the current source circuits.

16. A phase interpolator for receiving an input clock signal and outputting an clock recovery signal having a predetermined phase, comprising:
    a plurality of reference stages, the reference stages receiving a reference signal having a predetermined phase and outputting a scaled clock signal, wherein the reference stages comprise a plurality of current source circuits, the current source circuits receiving the reference signal and outputting a differential component signal, the current source circuits comprising:
        a first transistor having a drain, a source, and a gate, the first transistor receiving the reference signal;
        a second transistor having a drain, a source, and a gate, the drain of the second transistor coupled to the drain of the first transistor and receiving an inverse of the reference signal; and
        a current source coupled to the drain of the first transistor and the drain of the second transistor, the current source receiving a control signal, and outputting an output current to the first and second transistor in response to the control signal, wherein
            the differential component signal is the reference signal modified proportional to the output current;
            the scaled clock signal is the sum of the differential component signals generated by the current source circuits in a reference stage; and
    the drains of the first and second transistor are coupled to the drains of first and second transistors in each of the current source circuits in a reference stage.

* * * * *